United States Patent
Moyer

(10) Patent No.: US 7,385,446 B2
(45) Date of Patent: Jun. 10, 2008

(54) HIGH-IMPEDANCE LEVEL-SHIFTING AMPLIFIER CAPABLE OF HANDLING INPUT SIGNALS WITH A VOLTAGE MAGNITUDE THAT EXCEEDS A SUPPLY VOLTAGE

(75) Inventor: James Copland Moyer, San Jose, CA (US)

(73) Assignee: Monolithic Power Systems, Inc., Los Gatos, CA (US)

( * ) Notice: Subject to any disclaimer, the term of this patent is extended or adjusted under 35 U.S.C. 154(b) by 120 days.

(21) Appl. No.: 11/452,650

(22) Filed: Jun. 13, 2006

(65) Prior Publication Data
US 2007/0285159 A1 Dec. 13, 2007

(51) Int. Cl.
*H03F 1/36* (2006.01)
(52) U.S. Cl. ......................... 330/110; 326/80
(58) Field of Classification Search ............... 330/110; 327/333; 326/62, 67, 68, 80, 81
See application file for complete search history.

(56) References Cited
U.S. PATENT DOCUMENTS

| 4,536,666 A | * | 8/1985 | Metz et al. ................. 327/594 |
| 4,767,946 A | | 8/1988 | Taylor ......................... 307/264 |
| 5,264,744 A | | 11/1993 | Mizukami et al. .......... 307/475 |
| 5,510,735 A | | 4/1996 | Mahabadi ..................... 327/77 |
| 5,724,653 A | * | 3/1998 | Baker et al. ................. 455/296 |
| 6,548,979 B2 | * | 4/2003 | Boisvert et al. ............ 318/469 |
| 6,717,451 B1 | | 4/2004 | Klein et al. ................. 327/333 |
| 6,930,515 B2 | * | 8/2005 | Liu et al. ...................... 326/80 |

OTHER PUBLICATIONS

Marston, Ray "FET Principles and Circuits Part 2", Nuts & Volts Magazine, Jun. 2000.
National Semiconductor, LM1964 Sensor Interface Amplifier.
National Semiconductor, LM117/LM317.

* cited by examiner

*Primary Examiner*—Henry Choe
(74) *Attorney, Agent, or Firm*—Zilka-Kotab, PC

(57) ABSTRACT

A level-shifting amplifier is provided for level-shifting an input signal with a voltage magnitude that exceeds a supply voltage of the amplifier. In operation, the amplifier has an input impedance of greater than 100M Ohms.

53 Claims, 11 Drawing Sheets

US 7,385,446 B2

1

HIGH-IMPEDANCE LEVEL-SHIFTING AMPLIFIER CAPABLE OF HANDLING INPUT SIGNALS WITH A VOLTAGE MAGNITUDE THAT EXCEEDS A SUPPLY VOLTAGE

FIELD OF THE INVENTION

The present invention relates to amplifier circuits, and more particularly, to level-shifting amplifier circuits.

BACKGROUND

Level-shifting amplifiers include a class of amplifiers which shifts an input signal by a predetermined voltage. In some situations, it is desirable to handle an input signal with a range that extends beyond a supply voltage (i.e. rail) of a circuit. As set forth below, various circuits exist for such level-shifting purposes.

Prior art FIG. 1 illustrates an exemplary level-shifting amplifier circuit 100, in accordance with the prior art. Such circuit 100 includes an inverting operational amplifier LM324 with a non-inverting input coupled to ground. In use, the circuit 100 serves as a single-supply device powered by a positive rail with a return to ground. Since an input signal is inverted at an output signal of the circuit 100, the input signal may range from ground down to a negative voltage. Further, the output signal may swing from ground up to some (other) positive voltage determined by a ratio of feedback resistors R1, R2. Of course, the input impedance of the circuit 100 is the value of the input resistor R1.

Prior art FIG. 2 illustrates another exemplary level-shifting amplifier circuit 200, in accordance with the prior art. As shown, the instant circuit 200 dangles an emitter and base of a first pair of NPN bipolar transistors Q1, Q2 from a positive rail. Since all junction-isolated nodes are biased near the positive rail, an input signal may range as high as the positive rail minus a couple of volts down below a negative rail (ground) until a break down occurs. Depending on the design of the circuit 200, either the first transistor pair Q1, Q2 or a second transistor pair Q3, Q4 will break down first. The present circuit 200 is typically used in instrumentation amplifiers and high-speed digital line receivers. Further, the input signal being sensed generally must provide bias current for an input stage of the circuit 200.

Prior art FIG. 3 illustrates yet another exemplary level-shifting amplifier circuit 300, in accordance with the prior art. Such circuit 300 may traditionally be found in adjustable voltage regulators. As shown, a bandgap reference voltage Adj dangles below a substrate, which is connected to an output Vout of the circuit 300. A user-supplied resistor divider 302 is provided from the output Vout to a bottom of the reference to ground. The regulated output Vout is set as a function of a ratio of the resistors of the divider 302 times a value of the bandgap reference voltage Adj. Generally, an impedance of the resistive divider 302 is chosen to be fairly low, thus a current of the resistor divider 302 typically swamps a 10-20 uA current from a bottom of the bandgap reference voltage Adj.

Prior art FIGS. 4A and 4B illustrates still yet another exemplary level-shifting amplifier circuit 400, in accordance with the prior art. Such circuit 400 receives an input current i_ref 401 from a bias current generator. The current passes through an n-channel FET NE3 which serves as a power down disconnect. The current also passes through a conventional P-channel cascode current mirror formed by P-channel FETs pe3, pe5, pe6, pe1, pm7 and pm0. It may be noted that the FETs pe5 and pm0 have the same W/L parameters (i.e. width/length dimensions for FET gate, etc.), but the m-numbers (i.e. number of FETs connected in parallel, etc.) are in the ratio of 4:1. Consequently, the current in the output section of the current mirror (source-drain of pm0) is four times that of the input current i_refp.

Still referring to FIGS. 4A and 4B, current mirror output current (that is controlled primarily by FET pm0 and its cascode pm7) passes through a resistive load 421-424. In use, current passes through a source follower formed by a P-channel FET pf2 and an associated cascode device pif2. A voltage at node vout_p 460 is the sum of the input voltage vin_p (at node 470) plus offsets due to the resistive load 421-424 in addition to an offset due to the threshold of the source follower FET 451, and possibly other sources. As shown, gates of the FETs 451, 452 are tied together; this is operable because pif2 is a low threshold voltage type so that a constant 1.1V total appears across the source follower FET 451, thereby greatly increasing the linearity of the level-shifter across its full signal range.

With continued reference to FIGS. 4A and 4B, it should be appreciated that since a current through the resistive load 421-424 may need to generate a potential difference in the hundred(s) of millivolts, a bandwidth of the circuit 400 may become limited. Such an effect would be due to the time constant effect of the resistive load 421-424 working against the capacitance of the FETs 451, 452. In order to overcome excessive bandwidth limitation, an effectively high source impedance current source may formed by FET pair pe18 and pe19 to improve slew rate. This current source may be mirrored by a mirror circuit 485 from a supplied bias current ib using FETs pe30, pe22, pe23, pe24, pe25 working into FET pe18 and cascode FET pe19. It should also be appreciated that the action of the shifter in translating vin_p at node 470 to an offset vout_p at node 460 is for half (by convention the positive half) of a pair of differential signals. An entire duplicate shift arm of circuitry 490 exists for the negative signals vin_n to vout_n. That vin_p and vin_n are offset by a voltage which is set in both cases by current i_refp reflects the need for both signals to be offset by a near identical amount in order to avoid introducing error into the differential signal.

In use, the circuit 400 exhibits poor linearity with signals that exceed $V_{TO}$ beyond the rail. More information regarding such circuit 400 may be found with reference to U.S. Pat. No. 6,717,451.

Unfortunately, prior art amplifiers that level-shift a signal beyond a rail exhibit a low input impedance, or other characteristics that may potentially be undesirable. For example, some prior art amplifiers require a source to provide a significant bias current to power an input stage of the amplifier, etc. There is thus a need for overcoming these and/or other problems associated with the prior art.

SUMMARY

A level-shifting amplifier is provided for level-shifting an input signal with a voltage magnitude that exceeds a supply voltage of the amplifier. In operation, the amplifier has an input impedance of greater than 100M Ohms.

BRIEF DESCRIPTION OF THE DRAWINGS

Prior art

Prior art

Prior art

Prior art

DETAILED DESCRIPTION

Figure 1:
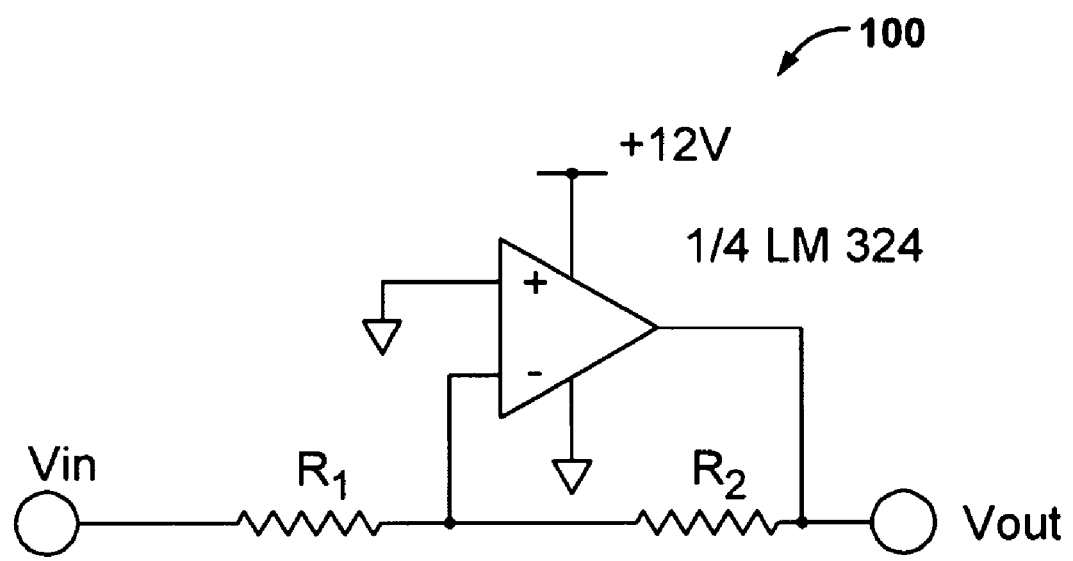
FIG. 1 illustrates an exemplary level-shifting amplifier circuit, in accordance with the prior art.
Figure 2:
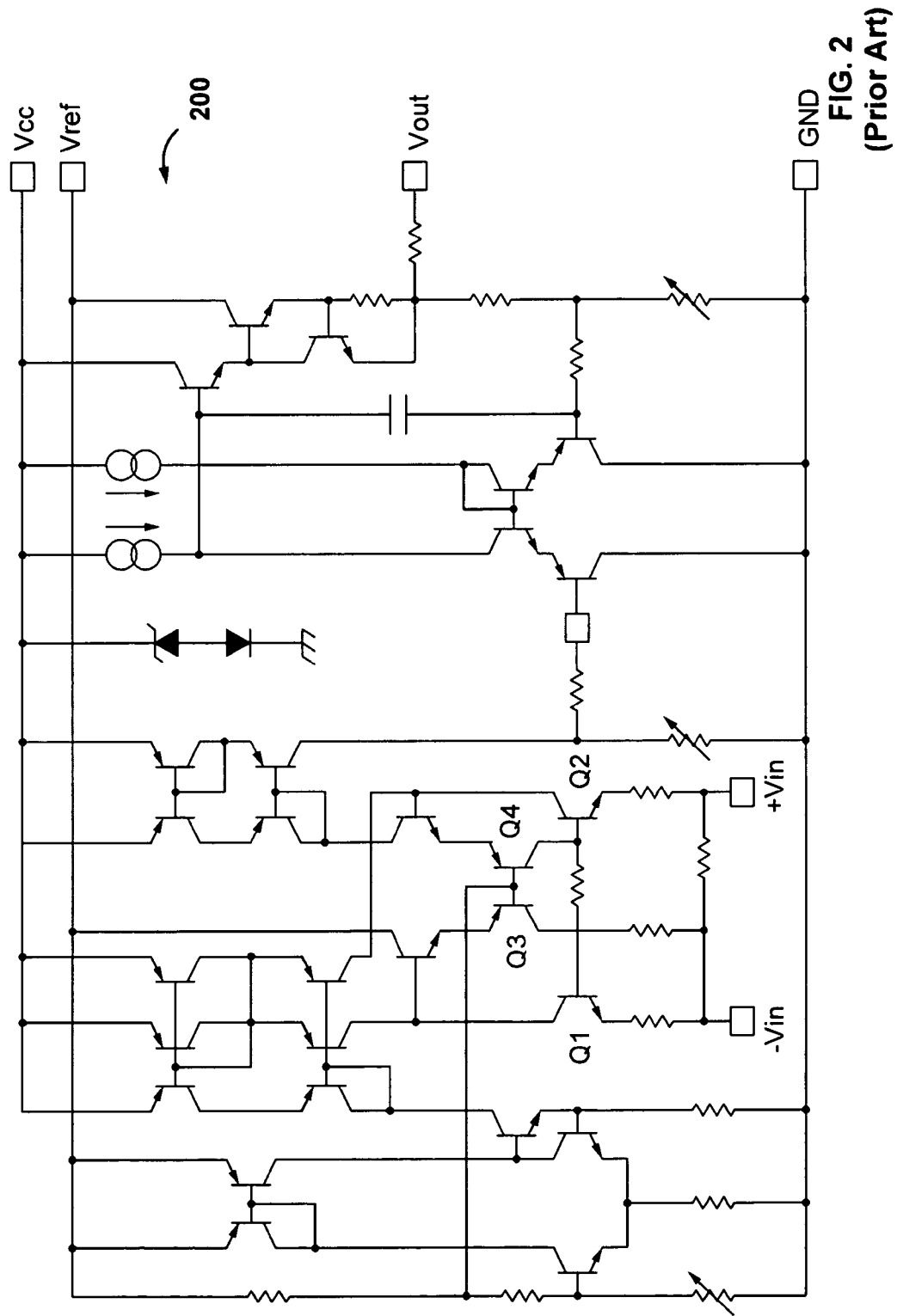
FIG. 2 illustrates another exemplary level-shifting amplifier circuit, in accordance with the prior art.
Figure 3:
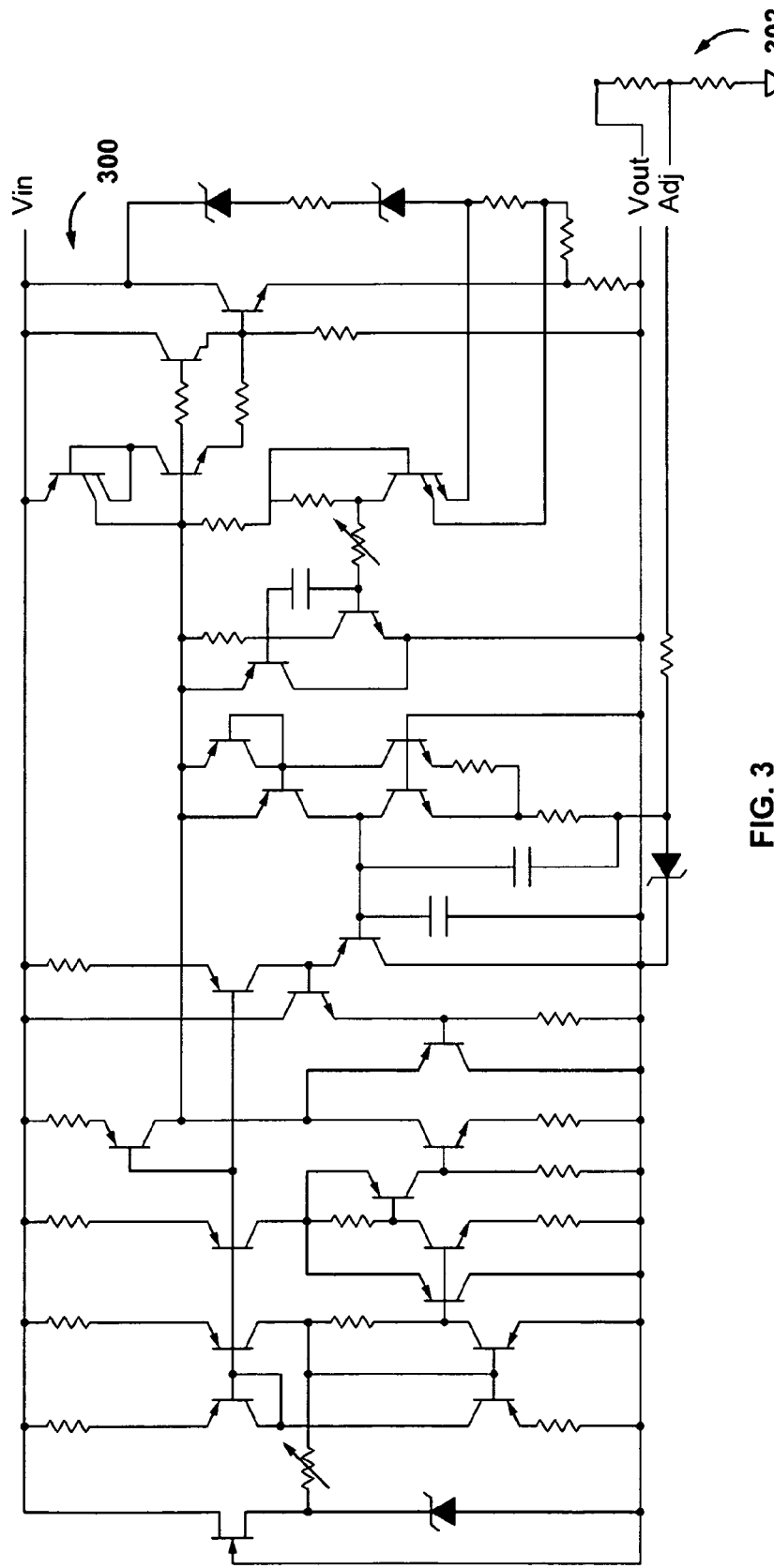
FIG. 3 illustrates yet another exemplary level-shifting amplifier circuit, in accordance with the prior art.
Figure 4A:
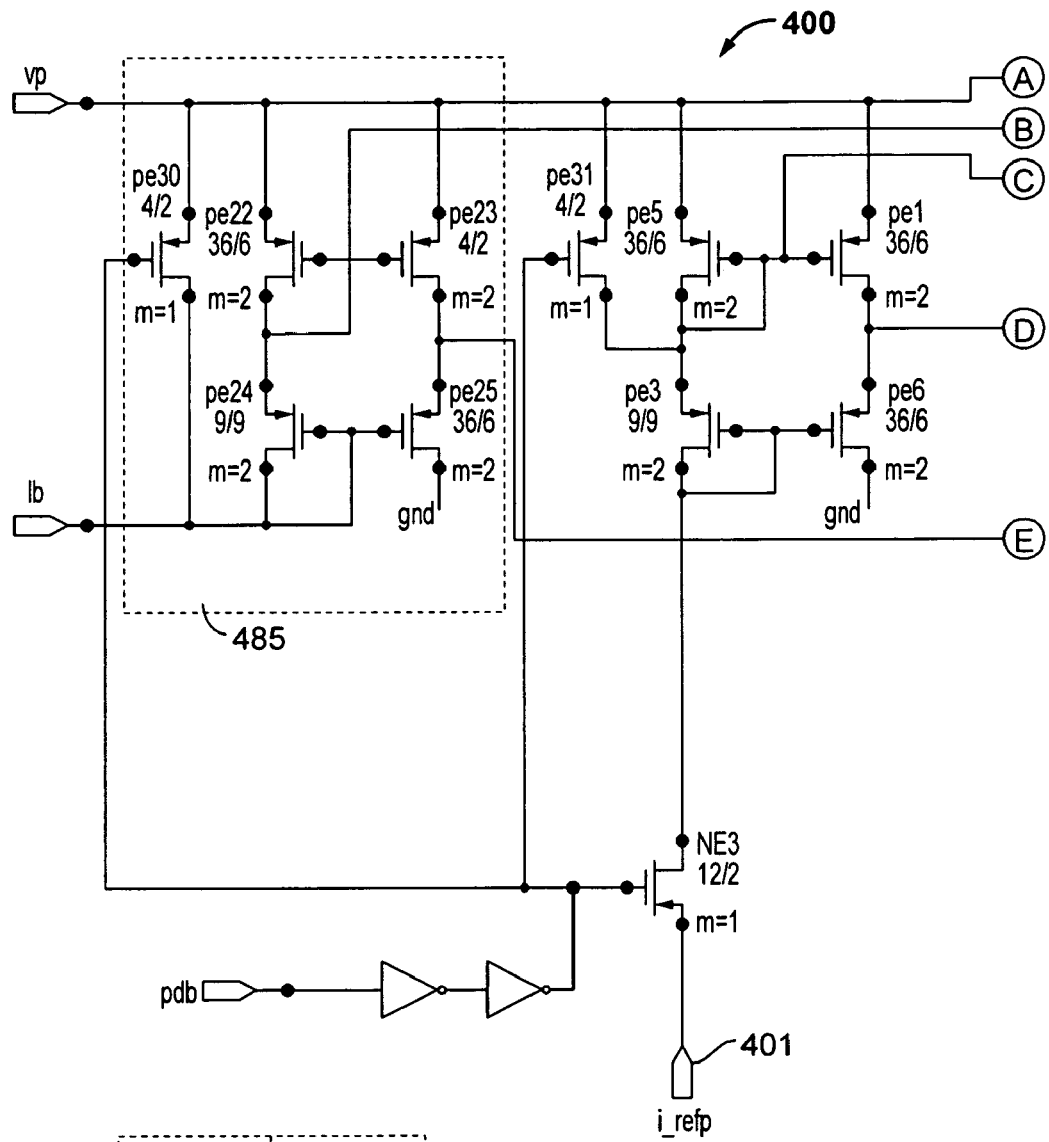
FIGS. 4A-4B illustrate still yet another exemplary level-shifting amplifier circuit, in accordance with the prior art.
Figure 4A:
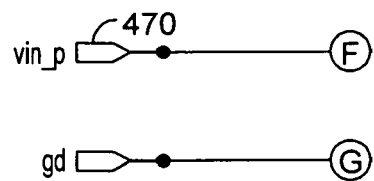
Figure 4B:
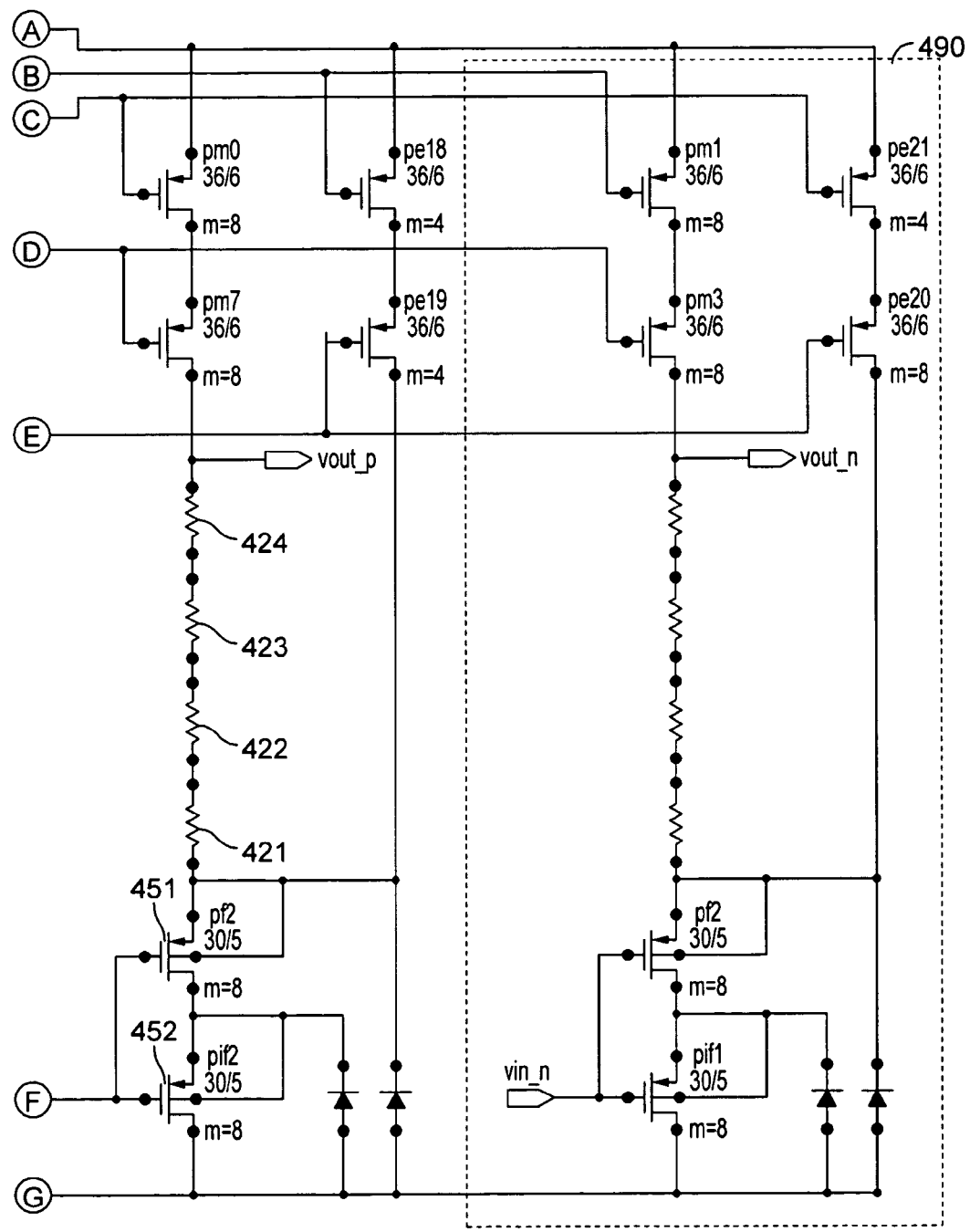
Figure 5:
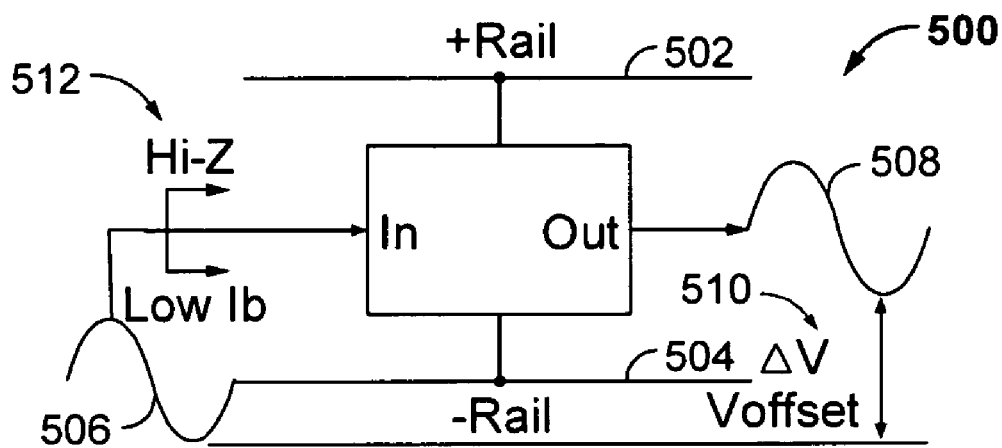
FIG. 5 illustrates a level-shifting amplifier circuit, in accordance with one embodiment.

FIG. 5 illustrates a level-shifting amplifier circuit 500, in accordance with one embodiment. As shown, the circuit 500 includes a first supply voltage rail 502 and a second supply voltage rail 504. In various embodiments, the first supply voltage rail 502 may provide a first predetermined voltage (e.g. positive voltage, etc.) while the second supply voltage rail 504 may provide a second predetermined voltage (e.g. negative voltage, ground, etc.).

In use, the circuit 500 is capable of receiving an input signal 506 with a voltage magnitude that exceeds a supply voltage associated with the first supply voltage rail 502 or second supply voltage rail 504. By way of example, the embodiment shown in FIG. 5 illustrates that the input signal 506 remains outside of the second supply voltage rail 504 which provides a negative voltage. Of course, while not shown, the first supply voltage rail 502 may be exceeded, etc.

Given this input signal 506, the circuit 500 operates to level-shift the input signal 506 in order to produce an output signal 508. Such output signal 508 exhibits a voltage that is offset with respect to that of the input signal 506 by a predetermined offset voltage 510. It should be noted that the circuit 500 may be constructed in any desired manner that is capable of carrying out the functionality set forth herein. Some exemplary designs which may or may not be employed will be set forth hereinafter in greater detail during reference to subsequent figures.

In operation, the circuit 500 exhibits a high input impedance 512. In the context of the present description, a high input impedance refers to an input impedance of greater than 100M Ohms. Of course, in other embodiments, a higher input impedance may be provided in the order of at least 1G Ohms, 10G Ohms, 100G Ohms, etc.

More illustrative information will now be set forth regarding various optional architectures and features with which the foregoing framework may or may not be implemented, per the desires of the user. For example, strictly as an option, the amplifier circuit 500 need not necessarily require a source of the input signal 506 to provide a significant bias current to power any input stage of the circuit 500 (e.g. less than 1 Femto-Amps at and below room temperature, etc.). It should be strongly noted, however, that this and the following information is set forth for illustrative purposes and should not be construed as limiting in any manner. Any of the following features may be optionally incorporated with or without the exclusion of other features described.

Figure 6:
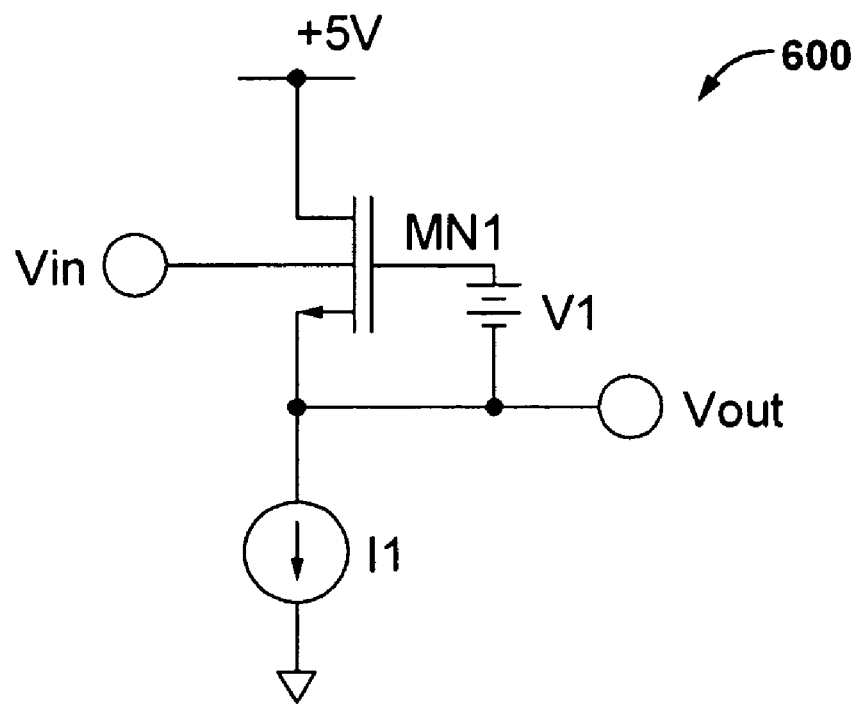
FIG. 6 illustrates a symbolically-represented level-shifting amplifier circuit, in accordance with another embodiment.

FIG. 6 illustrates a symbolically-represented level-shifting amplifier circuit 600, in accordance with another embodiment. As shown, the circuit 600 may employ an N-channel MOSFET MN1. In one exemplary construction, the MOSFET MN1 may be manufactured utilizing a CMOS process with isolated P-wells. Such MOSFET MN1 may include a drain coupled to a first supply voltage rail supplying a predetermined voltage (e.g. +5V, etc.), and a back gate (i.e. body electrode, P-well, etc.) acting as an input Vin capable of receiving an input signal. Coupled between a top gate and a source of the MOSFET MN1 is a voltage source V1 for providing a top gate-source bias. Still yet, a current source I1 is coupled between the source of the MOSFET MN1 and ground.

In use, an output signal is taken at the source of the MOSFET MN1 and the circuit 600 behaves as a voltage-follower. Following the general principles set forth during the description of the embodiment of FIG. 5, an input signal range may extend from below a second supply voltage rail (e.g. ground) by a couple of volts, up to within a couple of volts of the first supply voltage rail. Further, the aforementioned top gate-source bias drives an offset between input and output signal.

Still yet, an input bias current associated with the circuit 600 amounts to just a leakage of the P-well body of the N-channel MOSFET MN1 and the input impedance is high, particularly at lower frequencies. By using both the top gate and the back gate, another degree of freedom is provided which allows a bias current to be set more accurately across a production spread. Such also potentially eliminates a back gate modulation of the channel.

Figure 7:
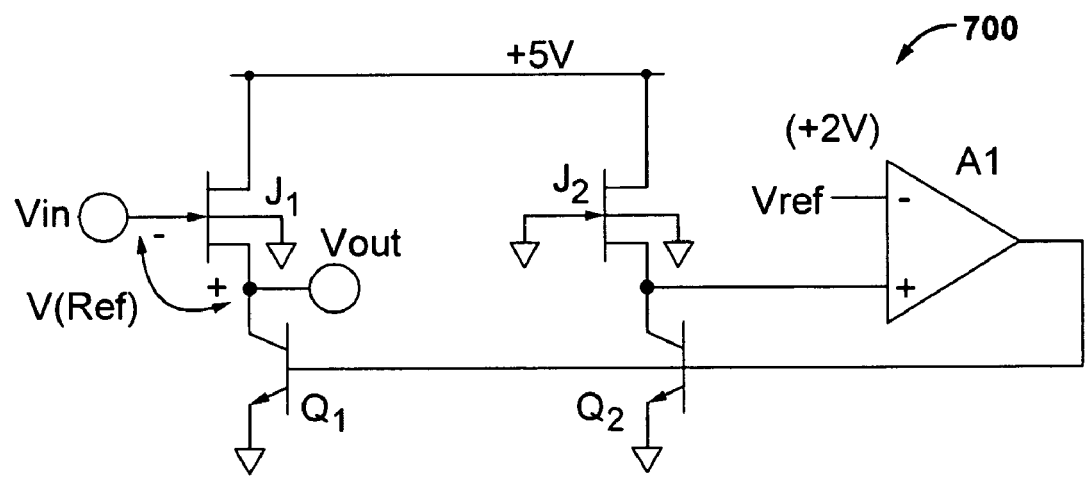
FIG. 7 illustrates a JFET-based level-shifting amplifier circuit, in accordance with yet another embodiment.

FIG. 7 illustrates a JFET-based level-shifting amplifier circuit 700, in accordance with yet another embodiment. Included is a first N-channel JFET J1 that is employed as a voltage-follower. As shown, the first N-channel JFET J1 includes a drain coupled to a first supply voltage rail supplying a predetermined voltage (e.g. +5V, etc.), a top gate serving as an input of the circuit 700, a back gate coupled to ground, and a source serving as an output of the circuit 700.

A bias current at the source of the first JFET J1 is generated by one of a matched pair of NPN bipolar transistors including a first bipolar transistor Q1 and a second bipolar transistor Q2. The bipolar transistors Q1, Q2 share a common base and grounded emitter nodes and, therefore, the collector currents thereof are equal. Still yet, a collector current of the second bipolar transistor Q2 is driven by a servo amplifier Al for setting a source of a second matching N-channel JFET J2 to a reference voltage Vref (e.g. +2V, etc.). As shown, such second JFET J2 includes a drain coupled to the first supply voltage rail, and a top and back gate both coupled to ground.

Because the second JFET J2 is designed to match the first JFET J1, the gate-source voltages of the JFETs J1, J2 are equal. Thus, a voltage at the source of the first JFET J1 is exactly Vref above the voltage at the gate of the first JFET J1 (i.e. the input). This relationship is maintained for an input signal at the gate of the first JFET J1 over a range from almost Vref below ground to almost Vref below the first supply voltage rail.

In use, a most negative input signal voltage that may be handled without distortion is limited by saturation at the collector of the first bipolar transistor Q1. Further, a most positive input signal voltage that may be handled without distortion is limited by a pinch-off voltage of the first JFET J1 (i.e. when the first JFET J1 departs from its saturation region, etc.).

Figure 8A:
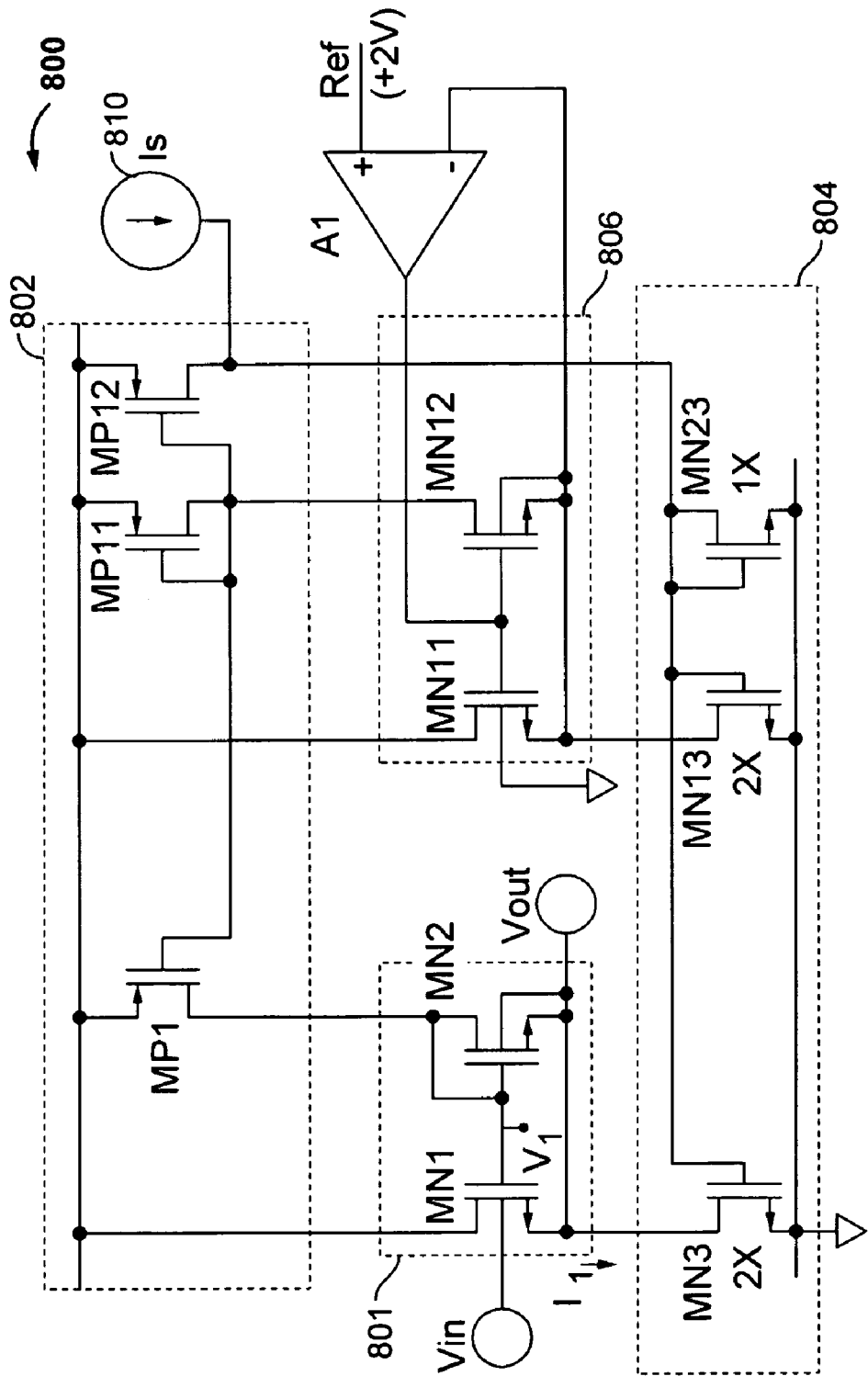
FIG. 8A illustrates a MOSFET-based level-shifting amplifier circuit, in accordance with still yet another embodiment.

FIG. 8A illustrates a MOSFET-based level-shifting amplifier circuit 800, in accordance with still yet another embodiment. As shown, the circuit 800 includes a signal amplifier circuit 801 which, in turn, includes a first N-channel MOSFET MN1 and a second N-channel MOSFET MN2. For reasons that will soon become apparent, the first N-channel MOSFET MN1 is scaled to be much stronger than (e.g. a multiple of two) the second N-channel MOSFET MN2. Of course, such strength may be controlled by setting an appropriate size of each transistor (e.g. sizing the transistors differently such that one is larger than the other, etc.).

As shown, the first N-channel MOSFET MN1 includes a drain coupled to a first supply voltage rail supplying a predetermined voltage (e.g. +5V, etc.), a back gate acting as an input Vin capable of receiving an input signal, and a top gate coupled to both a top gate and drain of the second N-channel MOSFET MN2. Such second N-channel MOSFET MN2 further includes a back gate that is coupled to the sources of both the MOSFETs MN1, MN2 and serves an output Vout. For reasons that will soon become apparent, a top gate-source voltage of the second N-channel MOSFET MN2 constitutes V1, and the signal amplifier circuit 801 operates as a voltage-follower.

Further included is a P-channel current mirror 802 including a first P-channel MOSFET MP1 having a source coupled to the first supply voltage rail, a drain coupled to the drain of the second N-channel MOSFET MN2, and a gate coupled to gates of a second and third P-channel MOSFET MP11, MP12 which each have a source coupled to the first supply voltage rail. While not shown, the back gates of the P-channel current mirror transistors may be coupled to the supply voltage rail. In use, a bias current of the second N-channel MOSFET MN2 is provided by the P-channel current mirror 802.

An N-channel current mirror 804 is also provided with a first N-channel MOSFET MN3 having a drain coupled to the output Vout, a grounded source, and a gate that shares a node with gates of second and third N-channel MOSFET MN13, MN23 each of which has a grounded source. While not shown, the back gates of the N-channel current mirror transistors may be coupled to ground.

In use, an input to the N-channel current mirror 804 is provided by the drain of the third P-channel MOSFET MP12 of the P-channel current mirror 802. To this end, a current I1 is provided by an output of the N-channel current mirror 804. Further, by sizing the N-channel current mirror transistors appropriately, the current in the P-channel mirror 802 is reflected and multiplied by two in the outputs of the N-channel current mirror 804.

Further provided is a matching amplifier circuit 806 including a first N-channel MOSFET MN11 and a second N-channel MOSFET MN12. The first N-channel MOSFET MN11 includes a drain coupled to the first supply voltage rail, a grounded back gate, a source coupled to a drain of the second N-channel MOSFET MN13 of the N-channel current mirror 804, and a top gate coupled to that of the second N-channel MOSFET MN12 of the matching amplifier circuit 806. The second N-channel MOSFET MN12 includes a drain coupled to the gates of the P-channel MOSFETs MP1, MP2, MP3 of the P-channel current mirror 802, and a back gate and source that are each coupled to the source of the first N-channel MOSFET MN11 of the matching amplifier circuit 806.

In the present embodiment, the N-channel MOSFETs MN11, MN12 of the matching amplifier circuit 806 are matched to the respective N-channel MOSFETs MN1, MN2 of the signal amplifier circuit 801. Thus, as mentioned earlier, a strength of the N-channel MOSFETs MN1, MN11 is greater than that of the MOSFETs MN2, MN12.

During operation, a bias current in the matching amplifier circuit 806 is provided by the N-channel current mirror 804. Further, by virtue of the multiplication of the appropriate current in the N-channel current mirror 804, both of the N-channel MOSFETs MN11, MN12 of the matching amplifier circuit 806 may be effectively biased. Still yet, an input to the P-channel current mirror 802 is provided by the drain of the second N-channel MOSFET MN12 of the matching amplifier circuit 806.

With continuing reference to FIG. 8A, a servo amplifier A1 is provided and configured as a servo loop in the manner shown. Specifically, the amplifier A1 is equipped with an output coupled to the gates of the N-channel MOSFETs MN11, MN12 of the matching amplifier circuit 806. An inverting input of the servo amplifier A1 is further coupled to the sources of such N-channel MOSFETs MN11, MN12, in the manner shown. Even still, an offset reference voltage (e.g. +2V) is established at a non-inverting input of the servo amplifier A1.

In use, both the current I1 and the voltage V1 are set up simultaneously by a servo loop including the servo amplifier A1. The servo loop serves to drive the gates of the N-channel MOSFETs MN11, MN12 of the matching amplifier circuit 806 positive until the sources of the matching amplifier circuit 806 is equal to the offset reference voltage (e.g. +2V). This, in turn, establishes a current in the second N-channel MOSFET MN12 of the matching amplifier circuit 806. Such current is, in turn, reflected by the P-channel mirror 802.

As mentioned earlier, such current in the P-channel mirror 802 is reflected and multiplied by two in the output of the N-channel current mirror 804. This operation simultaneously sets a source-to-back gate voltage of the first N-channel MOSFET MN11 of the matching amplifier circuit 806 to the offset reference voltage (e.g. +2V, etc.), and the drain current of such transistor equal to the drain current of the second N-channel MOSFET MN12 of the matching amplifier circuit 806. To this end, the voltage V1 becomes the top gate-to-source voltage of the second N-channel MOSFET MN12 of the matching amplifier circuit 806. Further, the current I1 becomes half of a current in the second N-channel MOSFET MN13 of the N-channel current mirror 804. Therefore, the source-to-back gate voltage of the first N-channel MOSFET MN1 remains equal to the offset reference voltage over a range of compliance of the current mirror outputs.

To ensure that the circuit 800 operates in an appropriate state, a current source 810 may be incorporated, as shown, for providing a fraction of start up current (e.g. 0.1*I1, etc.). While this results in additional current flowing through MOSFETs MN1, MN11, such does not detrimentally affect operation of the circuit 800, since the operating conditions of such transistors are matching.

Thus, the sources of the first and second N-channel MOSFETs MN1, MN2 may range from just above ground to within a predetermined amount (e.g. a volt or two, etc.) of the first voltage supply rail. Further, the input signal may range from a bit less than the offset reference voltage below ground, to within a predetermined amount (e.g. a volt or two minus the offset reference voltage) of the first voltage supply rail.

Table 1 shows exemplary output voltages, assuming that the offset reference voltage is +2V and the back gate of the MOSFET MN11 is grounded. Of course, these voltages are set forth for illustrative purposes only and should not be construed as limiting in any manner whatsoever.

TABLE 1

| Vin | Vout |
|---|---|
| −2 V | 0.2 V |
| −1.5 V | +0.5 V |
| −1 V | +1 V |
| 0 V | +2 V |

It should be noted that Vout is 0.2V instead of 0V at a Vin of −2V since the MOSFET MN3 is less able to perform as an ideal current source due to the collapsing of the drain voltage during such operation. Additional limitations may also exist if operation is attempted at higher voltages.

Figure 8B:
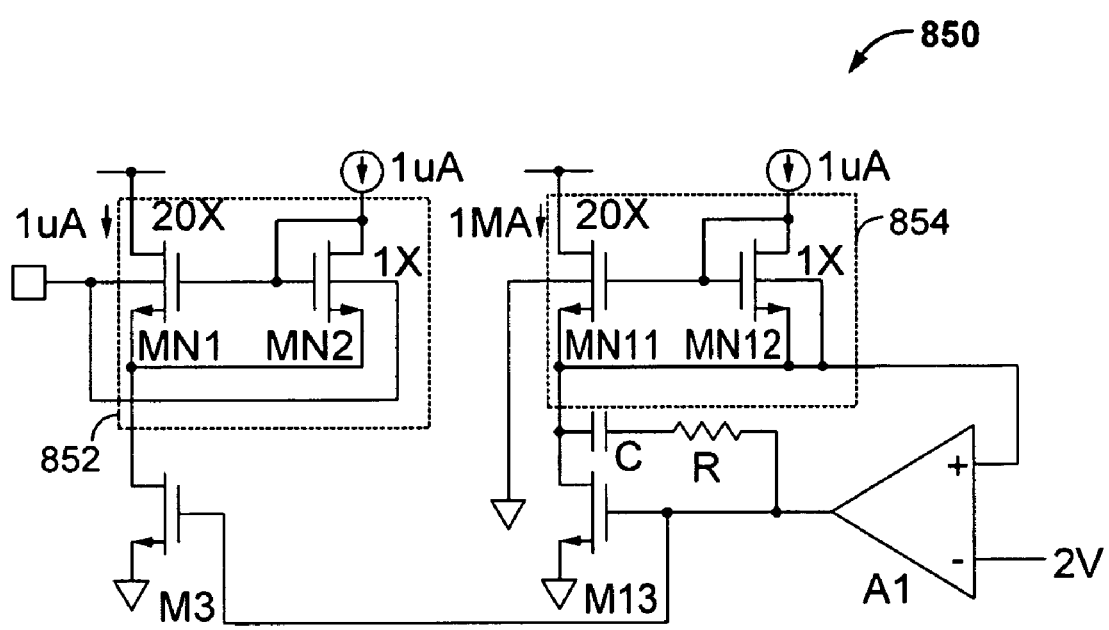
FIG. 8B illustrates another MOSFET-based level-shifting amplifier circuit, in accordance with another embodiment.

FIG. 8B illustrates another MOSFET-based level-shifting amplifier circuit 850, in accordance with another embodiment. Similar to the previous embodiment, the circuit 850 includes an amplifier circuit 852 with a pair of N-channel MOSFETs MN1, MN2 and a matching amplifier circuit 854 including a pair of N-channel MOSFETs MN11, MN12. As shown, such N-channel MOSFETs MN1, MN2 and N-channel MOSFETs MN11, MN12 are matched. Unlike the circuit 800 of FIG. 8A, the N-channel MOSFETs MN2, MN12 may be relatively weak.

Further included is an amplifier A1 with a negative input tied to a reference voltage and a positive input coupled to sources of the N-channel MOSFETs MN11, MN12 of the matching amplifier circuit 854. Still yet, an output of the amplifier A1 is coupled to a gate of another N-channel MOSFET MN3. Such N-channel MOSFET MN3 includes a source coupled to ground and a drain coupled to sources of the N-channel MOSFETs MN1, MN2 of the amplifier circuit 852.

A matched N-channel MOSFET MN13 also has a gate coupled to the output of the amplifier A1. The matched N-channel MOSFET MN13 includes a source coupled to ground and a drain coupled to sources of the N-channel MOSFETs MN11, MN12 of the matching amplifier circuit 854. A serially-coupled compensation resistor R and capacitor C are coupled between an output of the amplifier A1 and the sources of the N-channel MOSFETs MN11, MN12 of the matching amplifier circuit 854.

Figure 9:
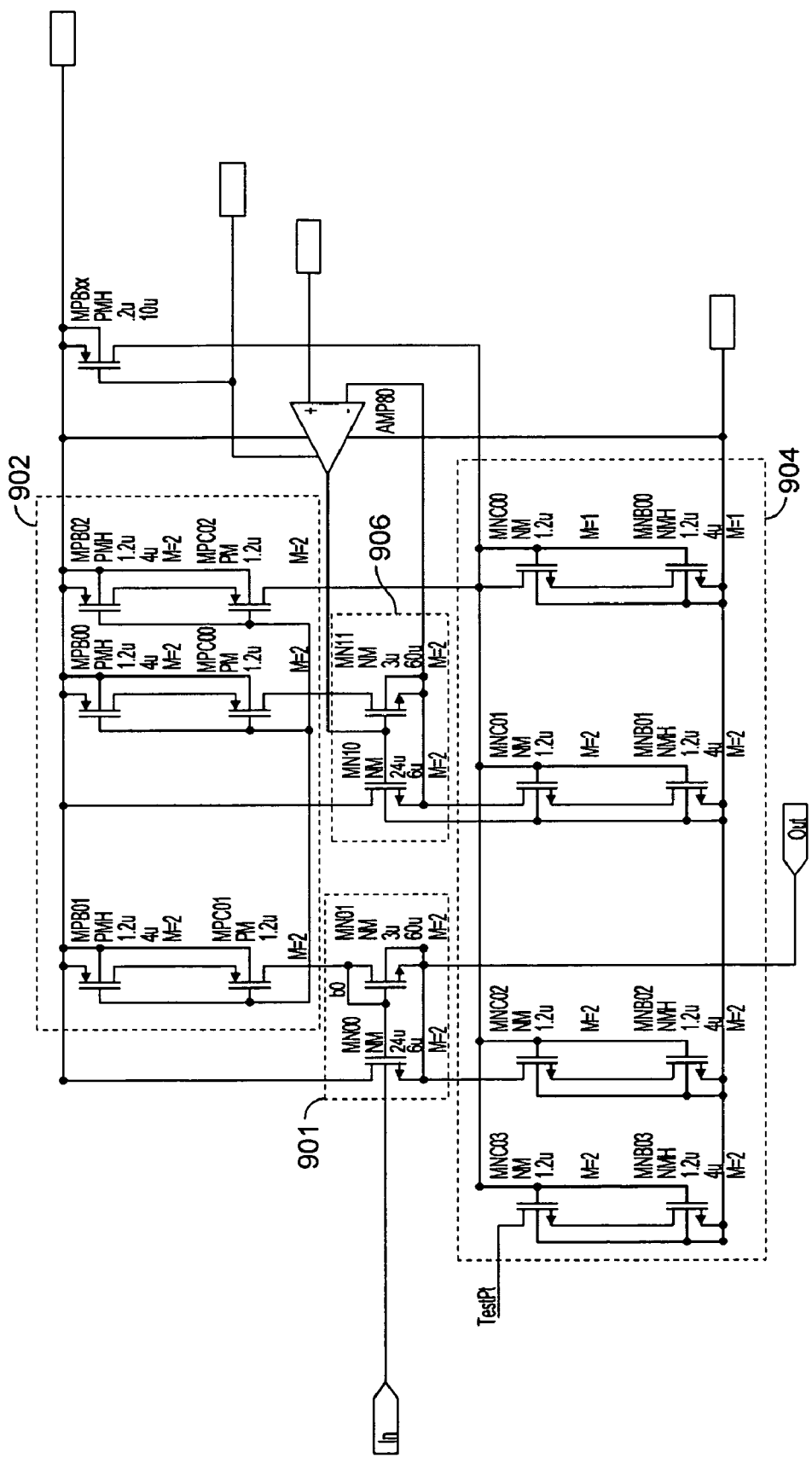
FIG. 9 illustrates yet another MOSFET-based level-shifting amplifier circuit, in accordance with still another embodiment.

FIG. 9 illustrates a level-shifting amplifier circuit 900, in accordance with another embodiment. As an option, the present circuit 900 may be implemented in the context of the circuit 800 of FIG. 8A. Of course, however, the circuit 900 may be implemented in any desired environment. It should be strongly noted that the values shown in association with the circuit 900 are presented strictly for illustrative purposes only and should not be construed as limiting in any manner.

Similar to the circuit 800 of FIG. 8A, a signal amplifier circuit 901, a P-channel current mirror 902, an N-channel current mirror 904, and a matching amplifier circuit 906 are provided along with the other components shown. As illustrated, however, the P-channel current mirror 902 and the N-channel current mirror 904 may each include transistor pairs configured in the manner shown. As yet another option, a dummy circuit may be provided (see transistors MNC03, MNB03) for allowing a test probe TestPt to be used.

As shown, a bias current through N-channel MOSFETs MN00, MN01 is about 1 uA. During use, the bandwidth is about 1 MHz. In the present particular embodiment, a range of the input signal extends from about minus 1.3V up to ground and a linear range of the circuit 900 is from about −1.8V up to about +1.3V. In one embodiment, the offset may be less than 5 mV and linearity may be better than 5 mV. Some improvement in linearity may be provided by cascading the target (MN00) and matching (MN10) transistors at some sacrifice in positive signal range.

By matching the relevant devices in the manner shown and operating the same under identical bias conditions, such devices have the same relative electrode potentials. This, in turn, provides a basis for improved precision. In various embodiments, the matching devices may be laid out on a common centroid. Large gate areas may optionally be used to minimize any effects of normal process geometry variations.

Similarly, device bias currents may be matched over an entire range of the input signal. Such may require long channel devices in the mirrors or cascode topologies to maximize the output impedance of the current sources. With the device sizes shown in the circuit 900 of FIG. 9, matching better than 5 mV and gain linearity better than 5 mV may be achieved for an input voltage from about −1.6V to +0.6V. Further, the N-channel MOSFETs MN00, MN01 may each bias up at about 1 uA and the voltage follower has enough bandwidth to accurately follow a 100 KHz signal.

Figure 10:
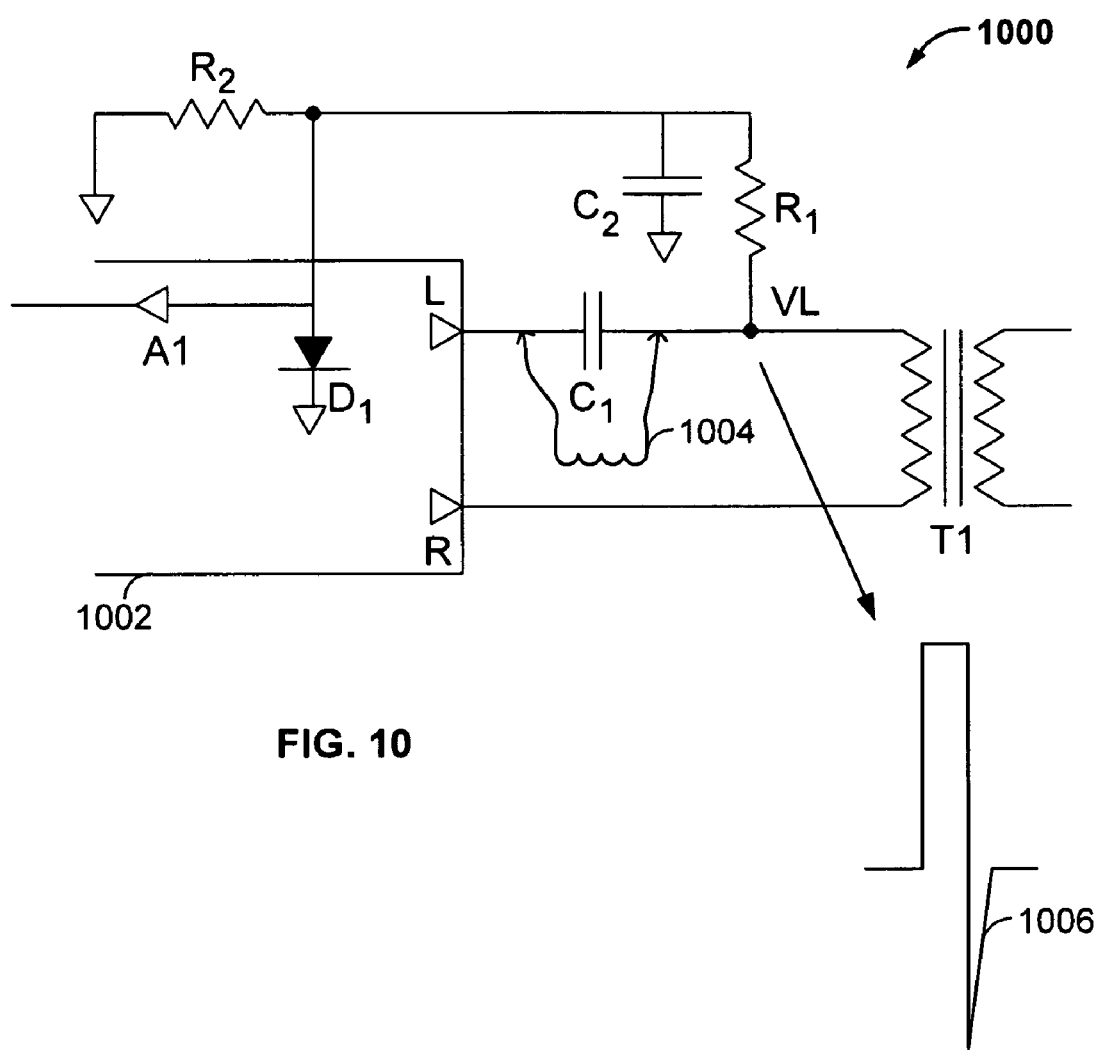
FIG. 10 illustrates a circuit in which various level-shifting circuits may be implemented in accordance with another embodiment.

FIG. 10 illustrates a circuit 1000 in which the various level-shifting circuits may be implemented in accordance with another embodiment. It should be noted that the present circuit 1000 represents one of many applications in which the level-shifting amplifier circuits disclosed herein may be used. Thus, it should be strongly noted that the circuit 1000 is presented strictly for illustrative purposes only and should not be construed as limiting in any manner.

As shown, the circuit 1000 includes a full bridge system 1002 with a left and right output L, R that drives a transformer T1 at resonance. In use, the voltage levels of the left and right output L, R result in large pulses on both ends of a coupling capacitor C1. Further, a negative portion of a voltage VL may be used to identify a current in the transformer T1 by virtue of knowledge of the size of capacitor C1, operating frequency, etc.

Further provided is a resistor divider including a pair of resistors R1, R2 and an input that is tied to an amplifier A1 which may include any of those mentioned hereinabove. To ensure that only on the negative portion of a voltage VL feeds the amplifier A1, a clamping diode D1 is provided.

For the purpose of testing fault conditions, etc., a clip lead 1004 is sometimes used to short the capacitor C1. Due to the length of clip lead 1004, an inductance is provided that, in turn, leads to a negative spike in the voltage VL. Note spike 1006. As an option, a resistor divider (see resistors R1, R2) exhibiting a high-Z may allow a stray parasitic capacitor C2 to be incorporated in the manner shown to filter out such negative spike 1006. In another embodiment, a size of the resistors R1, R2 may be enlarged for power efficiency purposes and further thereby obviate the need for the capacitor C2.

By this design, the amplifier A1 may be used to extract information from the negative portion of the voltage VL. The high input impedance of the amplifier A1 ensures that an input signal may be monitored via the resistor divider. Further, the level-shifting capabilities of the amplifier A1 makes certain that an output thereof resides within a supply voltage range of the full bridge system 1002.

While various embodiments have been described above, it should be understood that they have been presented by way of example only, and not limitation. For example, the various embodiments discussed hereinabove may be implemented to accommodate an input signal that extends above a positive rail by just inverting a polarity of each transistor (e.g. swapping NMOS and PMOS, etc.). Of course, any other integrated circuit-related features, techniques, etc. may be employed for providing the various embodiments set forth herein. Thus, the breadth and scope of a preferred embodiment should not be limited by any of the above-described exemplary embodiments, but should be defined only in accordance with the following claims and their equivalents.

What is claimed is:

1. An apparatus, comprising:
a level-shifting amplifier for level-shifting an input signal with a voltage magnitude that exceeds a supply voltage of the amplifier;
wherein the level-shifting amplifier has an input impedance of greater than 100M Ohms.

2. The apparatus of claim 1, wherein the level-shifting amplifier includes a voltage-follower circuit.

3. The apparatus of claim 2, wherein the voltage-follower circuit includes a transistor with a source serving as an output of the level-shifting amplifier and a back gate serving as an input of the level-shifting amplifier.

4. The apparatus of claim 3, wherein the voltage-follower circuit includes another transistor with a source and a back gate coupled to the output.

5. The apparatus of claim 1, wherein the voltage-follower circuit includes at least one MOSFET.

6. The apparatus of claim 5, wherein the voltage-follower circuit includes an N-channel MOSFET.

7. The apparatus of claim 1, wherein the voltage-follower circuit includes at least one JFET.

8. The apparatus of claim 7, wherein the voltage-follower circuit includes an N-channel JFET.

9. The apparatus of claim 1, wherein the voltage-follower circuit includes a first transistor and a second transistor.

10. The apparatus of claim 9, wherein the first transistor is sized differently than the second transistor.

11. The apparatus of claim 2, and further comprising a matching circuit including a plurality of transistors that match a plurality of transistors of the voltage-follower.

12. The apparatus of claim 11, and further comprising an operational amplifier including an output coupled to the matching circuit.

13. The apparatus of claim 12, wherein a first input of the operational amplifier receives feedback.

14. The apparatus of claim 13, wherein a second input of the operational amplifier receives a reference offset voltage.

15. The apparatus of claim 14, wherein the level-shifting amplifier level-shifts the input signal an amount that is a function of the reference offset voltage.

16. The apparatus of claim 1, and further comprising a current source.

17. The apparatus of claim 16, wherein the current source includes at least one current mirror.

18. The apparatus of claim 17, wherein the at least one current mirror includes a pair of bipolar transistors.

19. The apparatus of claim 18, wherein the bipolar transistors include NPN bipolar transistors.

20. The apparatus of claim 17, wherein the at least one current mirror includes a pair of current mirrors.

21. The apparatus of claim 20, wherein the pair of current mirrors includes a P-channel current mirror and an N-channel current mirror.

22. The apparatus of claim 17, wherein the at least one current mirror includes a plurality of transistors, where a first transistor is sized differently than a second transistor.

23. The apparatus of claim 1, wherein the level-shifting amplifier has an input impedance of greater than 1G Ohms.

24. The apparatus of claim 1, wherein the level-shifting amplifier has an input impedance of greater than 10G Ohms.

25. The apparatus of claim 1, wherein an input bias current associated with the input signal is less than 1 Femto-Amps.

26. The apparatus of claim 1, wherein the level-shifting amplifier is a component of a full bridge system.

27. A method, comprising:
receiving an input signal utilizing a level-shifting amplifier, where a voltage magnitude of the input signal exceeds a supply voltage of the amplifier; and
level-shifting the input signal utilizing the level-shifting amplifier;
wherein the level-shifting amplifier has an input impedance of greater than 100M Ohms.

28. The method of claim 27, wherein the level-shifting amplifier includes a voltage-follower circuit.

29. The method of claim 28, wherein the voltage-follower circuit includes a transistor with a source serving as an output of the level-shifting amplifier and a back gate serving as an input of the level-shifting amplifier.

30. The method of claim 29, wherein the voltage-follower circuit includes another transistor with a source and a back gate coupled to the output.

31. The method of claim 28, wherein the voltage-follower circuit includes at least one MOSFET.

32. The method of claim 31, wherein the voltage-follower circuit includes an N-channel MOSFET.

33. The method of claim 28, wherein the voltage-follower circuit includes at least one JFET.

34. The method of claim 33, wherein the voltage-follower circuit includes an N-channel JFET.

35. The method of claim 28, wherein the voltage-follower circuit includes a first transistor and a second transistor.

36. The method of claim 35, wherein the first transistor is sized differently than the second transistor.

37. The method of claim 28, wherein a matching circuit is included with a plurality of transistors that match a plurality of transistors of the voltage-follower.

38. The method of claim 37, wherein an operational amplifier is included with an output coupled to the matching circuit.

39. The method of claim 38, wherein a first input of the operational amplifier receives feedback.

40. The method of claim 39, wherein a second input of the operational amplifier receives a reference offset voltage.

41. The method of claim 40, wherein the level-shifting amplifier level-shifts the input signal an amount that is a function of the reference offset voltage.

42. The method of claim 27, and further comprising a current source.

43. The method of claim 42, wherein the current source includes at least one current mirror.

44. The method of claim 43, wherein the at least one current mirror includes a pair of bipolar transistors.

45. The method of claim 44, wherein the bipolar transistors include NPN bipolar transistors.

46. The method of claim 43, wherein the at least one current mirror includes a pair of current mirrors.

47. The method of claim 46, wherein the pair of current mirrors includes a P-channel current mirror and an N-channel current mirror.

48. The method of claim 43, wherein the at least one current mirror includes a plurality of transistors, where a first transistor is sized differently than a second transistor.

49. The method of claim 27, wherein the level-shifting amplifier has an input impedance of greater than 1G Ohms.

50. The method of claim 27, wherein the level-shifting amplifier has an input impedance of greater than 10G Ohms.

51. The method of claim 27, wherein an input bias current associated with the input signal is less than 1 Femto-Amps.

52. The method of claim 27, wherein the level-shifting amplifier is a component of a full bridge system.

53. A system, comprising:

an integrated circuit;

a level-shifting amplifier embodied on the integrated circuit for level-shifting an input signal with a voltage magnitude that exceeds a supply voltage of the amplifier;

wherein the level-shifting amplifier has an input impedance of greater than 100M Ohms.

* * * * *